United States Patent [19]

Dvorak

[11] Patent Number: 4,523,143

[45] Date of Patent: Jun. 11, 1985

[54] DIGITAL LOGIC LEVEL COMPARATOR PARTICULARLY FOR DIGITAL TEST SYSTEMS

[75] Inventor: Robert V. Dvorak, Scotia, N.Y.

[73] Assignee: Fairchild Camera and Instrument Corporation, Clifton Park, N.Y.

[21] Appl. No.: 389,880

[22] Filed: Jun. 18, 1982

[51] Int. Cl.³ .......................................... G01R 19/165
[52] U.S. Cl. ................................. 324/133; 324/73 R; 340/661
[58] Field of Search ............................ 324/133, 73 R; 340/660–663

[56] References Cited

U.S. PATENT DOCUMENTS 3,742,351  6/1973  Palmer et al. .................... 324/133 X

OTHER PUBLICATIONS

Edgington et al., Diagnostic Probe, *IBM Technical Disclosure Bulletin*, vol. 12, No. 6, Nov. 1969, pp. 828, 829.
Czechlewski et al., Pulse and Level Detector Circuit, *Western Electric Technical Digest*, No. 35, Jul. 1974, pp. 11–13.
Saul, Peter, A Versatile Voltage Monitor for Multi--Rail Systems, *Electron*, No. 124, Oct. 13, 1977, p. 80.

*Primary Examiner*—Gerard R. Strecker
*Attorney, Agent, or Firm*—Randall J. Gort

[57] ABSTRACT

A digital comparator for determining whether a digital test signal qualifies as an expected logic level, particularly suited to in-circuit digital testing applications. First and second comparing circuits, each formed by a differential amplifier circuit, receive the test signal, a high threshold signal and a low threshold signal. A control circuit selectively enables and inhibits the two comparing circuits so that only one is operative at any instant depending on the expected level of the test signal. The output terminals of the comparing circuits are connected so that the enabled one of the comparing circuits directly provides a pass/fail indication. A standby circuit allows both comparing circuits simultaneously to be selectively energized or deenergized, and an input buffer circuit permits the selective variation of the input impedance of the comparing circuit on the basis of the type of test being performed.

13 Claims, 5 Drawing Figures

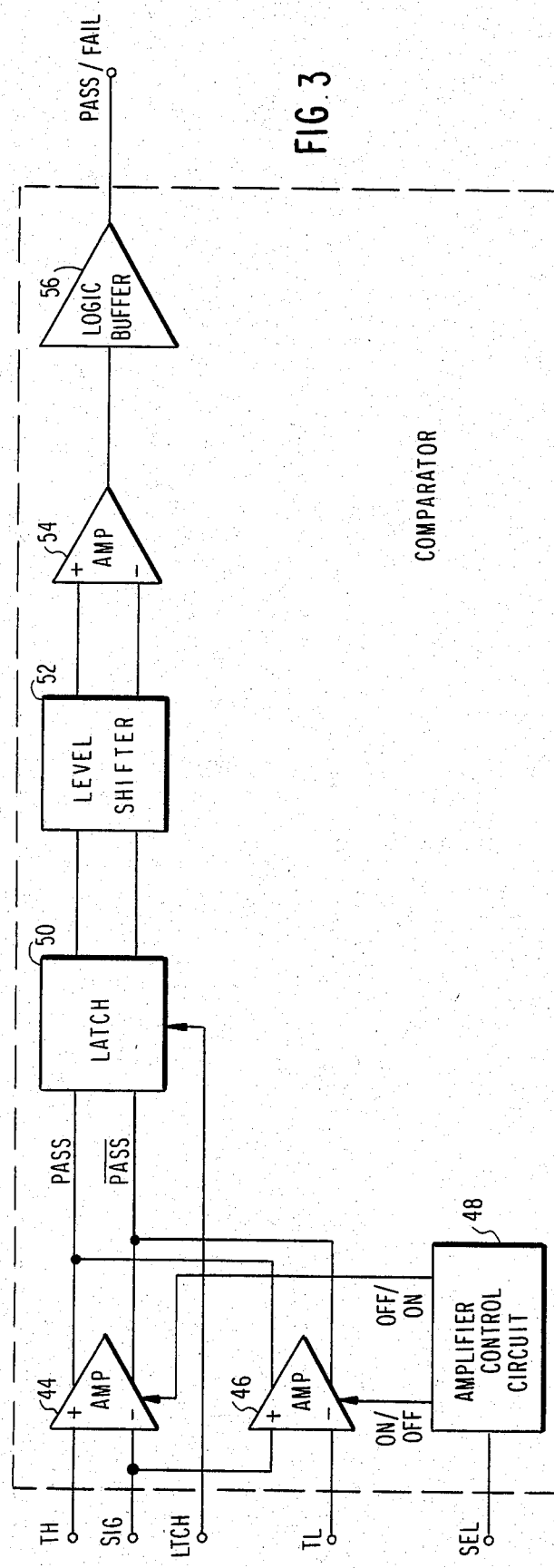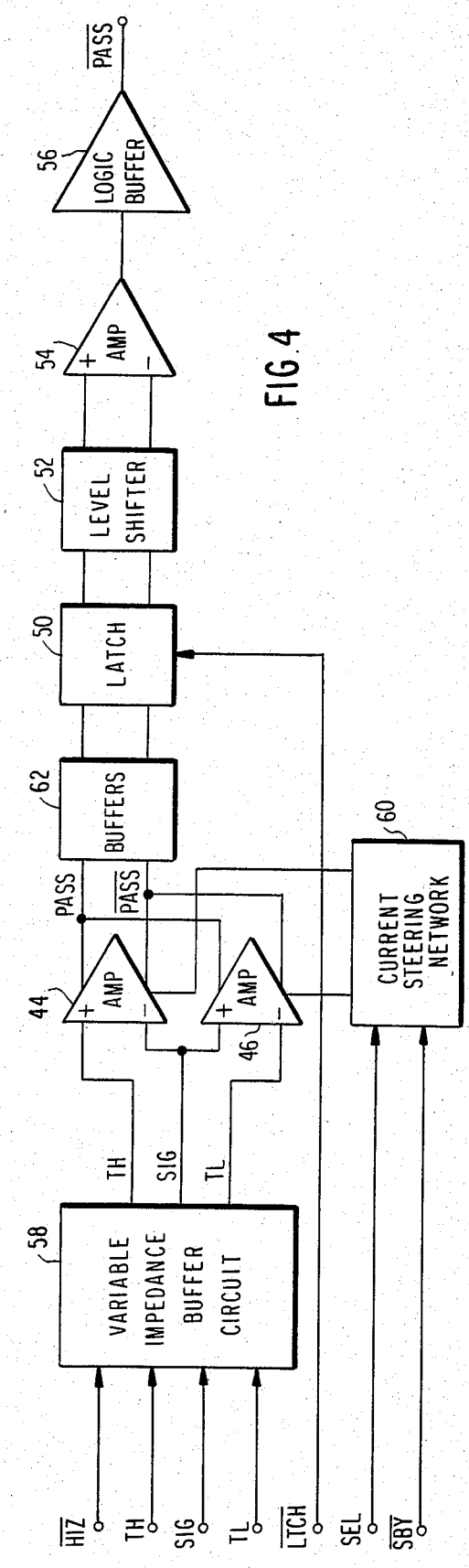

DIGITAL LOGIC LEVEL COMPARATOR PARTICULARLY FOR DIGITAL TEST SYSTEMS

BACKGROUND OF THE INVENTION

1. Field of The Invention

The present invention relates to digital test systems of the type in which digital signals which are present within electrical circuits under test are monitored and tested to determine if they qualify as a logic level expected to result from predetermined digital tests and, particularly, to a digital comparator for determining if the level of a digital test signal qualifies as an expected logic level.

2. State of The Prior Art

It is quite common in digital test equipment to test the level of a digital signal in order to determine if the signal level meets certain preset standards and therefore qualifies as a particular logic level. In digital test equipment of the "in-circuit" type, for example, individual digital devices (e.g., integrated circuits) on a larger unit such as a printed circuit board are tested by providing access to all the necessary terminals of the devices and then exercising the devices in accordance with some predetermined functional routine.

In such a system, the devices are exercised by applying digital stimulus signals to appropriate terminals of the devices so that the devices produce resultant output signals. These output signals (hereinafter "test signals") are monitored and are tested to determine if they are indeed at a logic level expected to result from the test being performed and therefore if the devices are operating properly. The monitoring and testing procedure is usually carried out by digital comparators which use appropriate standards to first determine if the signal level of the test signal qualifies as one of a plurality of possible logic levels and secondly, if that signal level is the one logic level expected to result from the test.

Known digital comparators of the type described above ordinarily have a complete comparison and signal conditioning channel for each logic level which is permissible in the type of device being tested. Moreover, a logic circuit is also required to test the comparator results against an expected test result in order to ensure that the detected logic level is as expected. Thus, for example, for bistate or binary device testing there are two complete comparison and signal conditioning channels and a logic circuit associated with each digital comparator.

In addition, known digital comparators used for in-circuit testing have an input impedance which is fixed at a value calculated to maximize accuracy and speed for all types of tests that may be performed by the test system. This value obviously cannot be ideal for all types of tests since in most tests a relatively low impedance is required for maximum testing speed and accuracy, yet in other tests a relatively high input impedance is required.

Further, digital testers of the in-circuit type may have a large number of comparators (e.g., one for each pin of the test fixture). Only a relatively small number of these comparators are necessary at any instant during a test of a digital device on the unit under test yet all of the comparators are fully energized during each test in the sense that they are powered and are drawing supply current, although their outputs may be ignored at that instant.

OBJECTS AND BRIEF SUMMARY OF THE INVENTION

It is accordingly one object of the present invention to provide a novel digital comparator which is simpler in construction than comparable prior art comparators, requires less bias current to achieve the same speed of operation and includes control features not available in prior art comparators.

It is a more specific object of the present invention to provide a novel digital comparator in which a test signal is tested to determine if it qualifies as an expected logic level in the case of a bi-level logic circuit, through the use of a pair of differential amplifiers the outputs of which are connected in parallel to a single comparison and signal conditioning channel, which differential amplifiers are selectively rendered operative and inoperative in accordance with the expected logic level of the test signal, thereby eliminating the need for a separate comparison and signal conditioning channel and a separate logic circuit for each differential amplifier.

It is yet another object of the present invention to provide an improved digital comparison system and method wherein the input impedance of comparators in the system is selectively variable in relation to the types of test being performed.

It is still another object of the present invention to provide an improved multi-comparator digital test system and testing method wherein each comparator can be energized and deenergized selectively as a function of the tests being performed, particularly, as a function of the test points being tested at any instant in a multipoint test system.

These and other objects and advantages are provided in accordance with the present invention through the provision of a novel digital comparator having two comparing circuits or means which are selectively enabled and inhibited in response to a control signal related to an expected digital logic level. Specifically, a first comparing means is provided which produces an output signal in response to a level of a digital test signal above a predetermined high threshold level, and a second comparing means is provided which produces an output signal in response to a level of the digital test signal below a predetermined low threshold level. Control means connected to the first and second comparing means selectively inhibit the production of the output signal from the first comparing means while enabling the production of the output signal from the second comparing means in response to an expected low logic level, or enable the production of the output signal from the first comparing means while inhibiting the production of the output signal from the second comparing means in response to an expected high logic level. The output signal from the enabled one of the first and second comparing means thereby indicates whether the digital test signal qualifies as the expected digital logic level.

Each comparing means preferably comprises a differential amplifier having inverting and non-inverting input terminals. The digital test signal is applied to an inverting input terminal of one differential amplifier and to the non-inverting input terminal of the other differential amplifier, and the high and low threshold levels represented by respective high and low level signals are applied to one and the other of the remaining inverting and the non-inverting input terminal of the differential amplifier. The control means, preferably a current steering network controlled by the expected level control signal, is connected to the differential amplifiers to selectively enable and inhibit their operation. Each of the differential amplifiers includes a pair of output terminals, and the output terminals of one amplifier are connected to like output terminals of the other amplifier to form two common output terminals providing a differential output signal from the either one of the amplifiers enabled by the control means.

In accordance with an additional feature of the invention, the input signals to the differential amplifiers are routed through buffer means to selectively vary the input impedance of the differential amplifiers in response to an impedance control signal. Also provided is a means for selectively enabling and disabling both the first and second differential amplifiers in response to a standby control signal.

BRIEF DESCRIPTION OF THE DRAWINGS

FIG. 3 is a functional block diagram generally illustrating a digital comparator in accordance with the present invention;

FIG. 4 is a functional block diagram of a more specific embodiment of the digital comparator in accordance with the present invention; and, FIG. 5 is a schematic circuit diagram of the digital comparator of FIG. 4.

DETAILED DESCRIPTION

Figure 1:
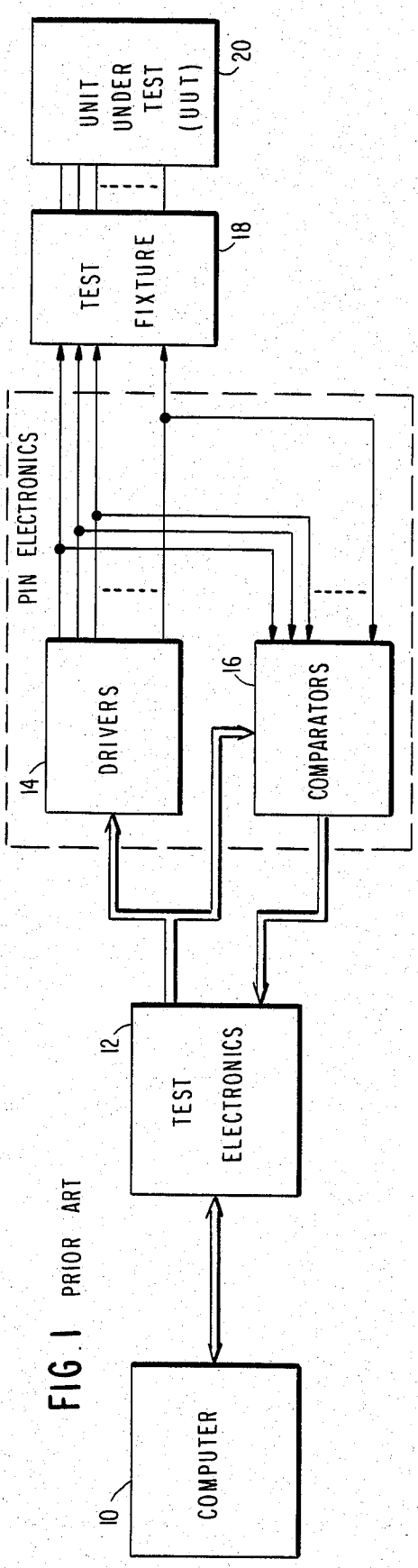
FIG. 1 is a functional block diagram of a typical prior art in-circuit digital test system.

FIG. 1 functionally illustrates a typical test system of the type utilized to test integrated circuits or other components mounted on a printed circuit board. Such test systems are usually referred to as "in-circuit" testers. As will be appreciated by one skilled in the art, the present invention is particularly useful in such applications, although it may be useful in other digital testing situations in which the level of a signal must be tested to provide a PASS/FAIL indication related to its binary value. Accordingly, the invention is described in connection with the in-circuit component tester illustrated functionally in FIG. 1, but the utility of the invention is not so limited.

Referring to FIG. 1, the typical in-circuit tester is controlled by a computer 10 which communicates through a suitable interface (not shown) with the system test electronics 12. The test electronics 12 receives data from the computer 10 and supplies appropriate test signals to drivers 14 and comparators 16 in a part of the system typically referred to as the "pin electronics". The drivers 14 produce stimulus signals of appropriate magnitude and duration in response to the signals from the test electronics 12 and supply these stimulus signals either directly, as illustrated, or through an appropriate switching or relay network to a test fixture 18 to which an electronic unit under test (UUT) 20 is connected in an appropriate manner. The test fixture 18 may be, for example, a conventional "bed of nails" fixture which contains numerous nails or pins to establish electrical contact with nodes on a printed circuit board to thereby provide access to the terminals of each individual component or device under test (DUT) on the unit under test.

Each circuit node contacted by the pins of the test fixture is connected directly (or through an appropriate switching or relay network) to the comparators 16 which in turn provide information to the test electronics 12. As will be discussed in greater detail hereinafter, each of the comparators may selectively determine the logic state of any signal level present on the node to which it is connected. In a bistate test system, for example, if the signal level on a particular node of interest is below some predetermined low threshold value, the comparator monitoring that node provides an output signal indicating that the signal on the node qualifies as a particular logic level (e.g., a binary "0"). Similarly, if the signal level on a particular node of interest is above some predetermined high threshold value, the comparator monitoring that node provides an output signal indicating that the signal on the node qualifies as a different logic level (e.g., a binary "1"). Appropriate logic circuitry connected to receive the results of these comparisons indicates whether the signal level on the monitored node is proper or improper in relation to an expected logic level. The results of these comparisons are provided to the test electronics 12 which in turn provides useful information to the computer 10 in order to indicate the success or failure of the test, the nature of any failures, etc.

Figure 2:
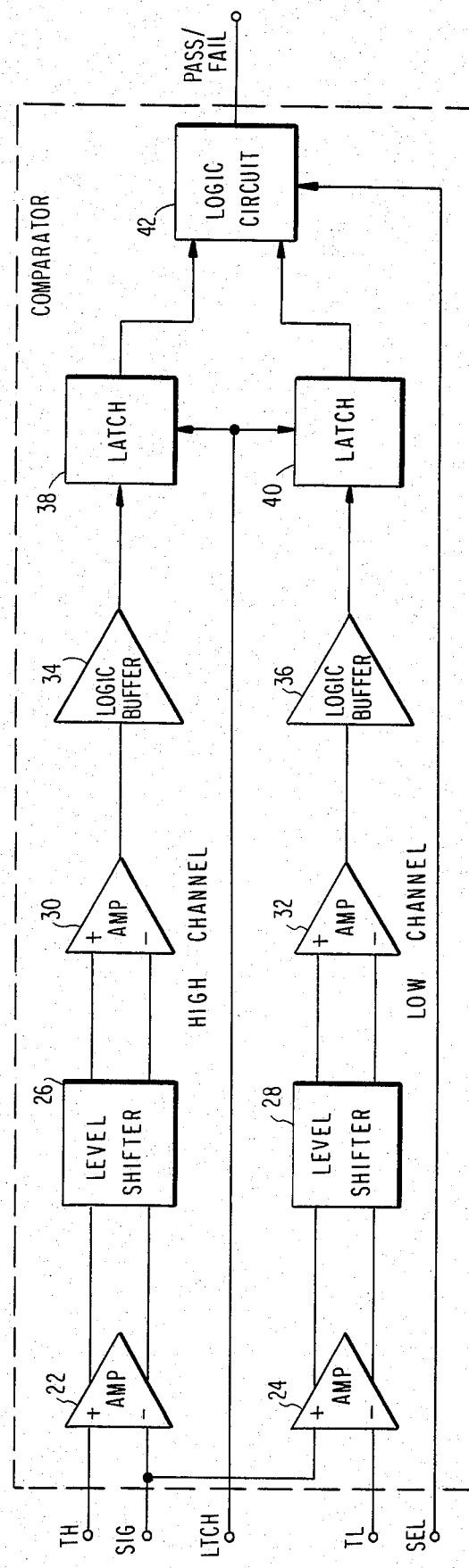
FIG. 2 is a functional block diagram of a prior art comparator useful in conjunction with the system of FIG. 1.

In a typical test system of the type illustrated in FIG. 1, the comparators include two complete amplifier circuits to compare the test signal against high and low threshold values and provide useful conditioned output signals which can be compared with an expected logic level, as is illustrated in FIG. 2. With reference to FIG. 2, a high threshold signal TH is applied to one input terminal of a first conventional differential amplifier 22 and a low threshold signal TL is applied to one input terminal of a second conventional differential amplifier 24. The test signal SIG to be compared with the threshold signals is supplied to a second input terminal of each of the amplifiers 22 and 24.

The differential amplifiers used to compare the levels of the test signal with the threshold signals are arranged so that one amplifier receives the test signal on what is usually referred to as the non-inverting input terminal (+) while the other amplifier receives the test signal on what is usually referred to as the inverting input terminal (−). In the illustrated comparator, for example, the test signal SIG is applied to the inverting input terminal of the differential amplifier 22 and to the non-inverting input terminal of the differential amplifier 24. The threshold signals TH and TL are then applied to the other, opposite input terminals of the amplifiers 22 and 24, e.g., the non-inverting input terminal of the amplifier 22 and the inverting input terminal of the amplifier 24. In this manner, a test signal must be above the high threshold TH to cause a change in the amplifier 22 output signal and must be below the low threshold to cause any change in the amplifier 24 output signal.

With continued reference to FIG. 2, the high and low threshold signals TH and TL represent the levels at which an input test signal SIG will be considered to be at a binary "1" logic level and a binary "0" logic level, respectively. It will be appreciated that a test signal SIG greater than the high threshold signal level will cause the amplifier 22 output signal to change from one level to another indicating the binary "1" condition has been satisfied. Similarly, a test signal SIG less than the low threshold signal level will cause a like change in the output signal of the amplifier 24 indicating the binary "0" condition has been satisfied. A test signal neither higher than the high threshold nor lower than the low threshold has no affect on the amplifier output signals.

The changes in the amplifier 22, 24 output signal levels caused by the above conditions typically are relatively small and occur in the upper regions of the amplifier output signal range, e.g., the changes may be about 0.5 volts or less and may be exhibited as variations between 7.0 to 7.5 volts (depending upon the power supply voltages and types of circuits used). Accordingly, conventional level shifters 26 and 28 are provided to shift the d.c. levels of the amplifier output signals, hereinafter referred to as the measurement signals, to a more acceptable range. Second stage amplifiers 30 and 32 further amplify the measurement signals, and conventional logic buffers 34 and 36 ensure that these signals are at appropriate logic levels. Conventional latches 38 and 40 store the measurement signals at the proper time as determined by a latch signal LTCH and a suitable logic circuit 42 compares the logic levels from the latches 38 and 40 to an expected logic level SEL to provide a PASS/FAIL indication.

It can be seen that in the typical prior art comparator circuit, two complete comparison and signal "shaping" channels, each including first and second stage amplifiers, a level shifter, a logic buffer and a latch are required to provide an indication as to whether a signal qualifies as a binary "1" or a binary "0". In addition, a logic circuit is required to then determine if the logic level detected and conditioned by the previous circuits is the expected logic level.

In accordance with the present invention, a dual threshold comparison of the type described above is provided through the use of a configuration which is simpler and provides increased speed for a bias current equal to that of conventional comparators. Moreover, the circuit of the present invention provides further features which are useful in various digital testing environments, particularly in the in-circuit type tester.

Referring now to FIG. 3 wherein one embodiment of a comparator in accordance with the present invention is illustrated functionally, a high threshold signal TH is supplied to one input terminal of a differential amplifier 44 and a low threshold signal TL is supplied to one input terminal of a differential amplifier 46. A test signal SIG is supplied to a second input terminal of each of the amplifiers 44 and 46. An expected signal level SEL is supplied to an amplifier control circuit 48 which controls the operation of the amplifiers 44 and 46. More specifically, the amplifier 44 is controlled by the amplifier control circuit output signal labelled OFF/ON and the amplifier 46 is controlled by the amplifier control circuit output signal labelled ON/OFF.

One output terminal of the amplifier 44 is connected to the like output terminal of the amplifier 46 to form a common output terminal designated the PASS output. The other like output terminals of each of the amplifiers 44 and 46 are connected to provide a common output terminal designated the $\overline{PASS}$ output. A differential output signal between the PASS and $\overline{PASS}$ output terminals of the amplifiers 44 and 46 is latched by conventional latches 50 which are controlled by a latch control signal LTCH. The differential output signals from the latches 50 are supplied to a conventional level shifter 52 which in turn supplies output signals to a conventional second stage differential amplifier 54. The output signal from the amplifier 54 is supplied through a logic buffer 56 as the PASS/FAIL output signal of the comparator.

The differential amplifier 44, when operative, compares the level of the test signal with the level of the high threshold signal TH and provides a differential output signal which indicates whether or not the test signal exceeds the high threshold. Similarly, the differential amplifier 46, when operative, compares the level of the test signal with the level of the low threshold signal TL and provides a differential output signal which indicates whether or not the test signal is lower than the threshold.

In the illustrated embodiment, the PASS output terminal assumes a low signal level with respect to the $\overline{PASS}$ output terminal when the test signal does not qualify as either a binary "1" or a binary "0". If, on the other hand, the test signal qualifies either as a binary "1" or a binary "0", the $\overline{PASS}$ output terminal assumes a low signal level with respect to the PASS output terminal. If the threshold signals applied to the differential amplifiers are reversed (i.e., if the low threshold signal is applied to the non-inverting input terminal of the amplifier 44 and the high threshold signal is applied to the inverting input terminal of the amplifier 46), the same relationship described above exists except with the $\overline{PASS}$ and PASS output terminals also reversed.

The latches 50 latch or temporarily store the relative signal levels on the PASS and $\overline{PASS}$ output terminals at the appropriate time in the test cycle and the level shifter shifts the level of this differential signal to an appropriate range as was previously described. The amplifier 54 amplifies the differential signal and the logic buffer 56 acts as an interface to ensure that the output signal is at an appropriate logic level for use by other logic circuits as was previously described.

It will be appreciated that if both the amplifier 44 and the amplifier 46 are operative, the information about the test signal provided by the output signal across the common output terminals is ambiguous. The amplifier control circuit 48, however, eliminates the ambiguity by ensuring that one or the other amplifiers 44 and 46 is inoperative, depending upon the expected logic level indicated by the SEL signal. For example, if the expected logic level is a binary "1", the amplifier 46 will be rendered inoperative by the amplifier control circuit 48 and the amplifier 44 will be rendered operative. Thus, if a differential output signal on the common output terminals of the amplifiers 44 and 46 indicates a pass condition the test signal must be an expected binary "1" since only the amplifier 44 is operative.

It can be seen that the circuit of FIG. 3 is much simpler than the prior art comparators and provides a pass/fail output indication without the need for a separate logic circuit as in the prior art. In addition, it will be appreciated by one skilled in the art that since one of the amplifiers 44 and 46 is inoperative and draws no bias current during the comparison process, the total bias current required to obtain the same speed as prior art comparators is one half of that required by the prior art comparators.

FIG. 4 functionally illustrates another embodiment of the comparator of the present invention with additional features useful in digital testing, particularly, in-circuit digital testing. Referring now to FIG. 4, wherein like numerical designations have been utilized to designate components previously described in connection with FIG. 3, the high and low threshold signals TH, TL and the test signal SIG are supplied through a variable impedance buffer circuit 58 to the amplifiers 44 and 46. The amplifiers 44 and 46 are connected as was previously described and are controlled between operative and inoperative conditions by a controller which, in this embodiment, is a conventional current steering network 60. The expected logic level signal SEL and a standby signal SBY control the current steering network 60 as will be described hereinafter.

The output signal from the common output terminals of the amplifiers 44 and 46 is supplied through buffers 62 to the latches 50 controlled by the LTCH signal. The differential output signal from the latch 50 is supplied to the level shifter 52 which in turn supplies its output signal to the amplifier 54. The amplifier 54 output signal is supplied through the logic buffer 56 as the pass/fail (PASS) signal.

The variable impedance buffer circuit 58 may be controlled between high and low impedances by the HIZ signal. Thus, for example, if an extremely high input impedance is desired for a particular type of testing, the variable impedance buffer circuit 58 may be controlled by the HIZ signal so that its input impedance is quite high. On the other hand, a low input impedance may be desired and, in such cases, the variable impedance buffer circuit 58 will be controlled by the HIZ signal to provide this lower input impedance.

The amplifiers 44 and 46 operate as was previously described and the control of their operative and inoperative conditions is effected by the current steering network 60. As will be seen hereinafter, the current steering network 60 is analogous to a single pole, double throw switch in the sense that it completes the circuit through one or the other of the amplifiers 44 and 46 on a mutually exclusive basis so that only one can be operative at any instant. As will be seen hereinafter, the standby signal SBY is essentially an on/off signal which selectively energizes the current steering network and amplifiers 44 and 46 as they are needed. The remainder of the circuits illustrated in FIG. 4 are the same as those previously described in connection with FIG. 3 with the exception of the buffer 62 which merely buffers the signal between the amplifier 44 and the latches 50.

Figure 5:
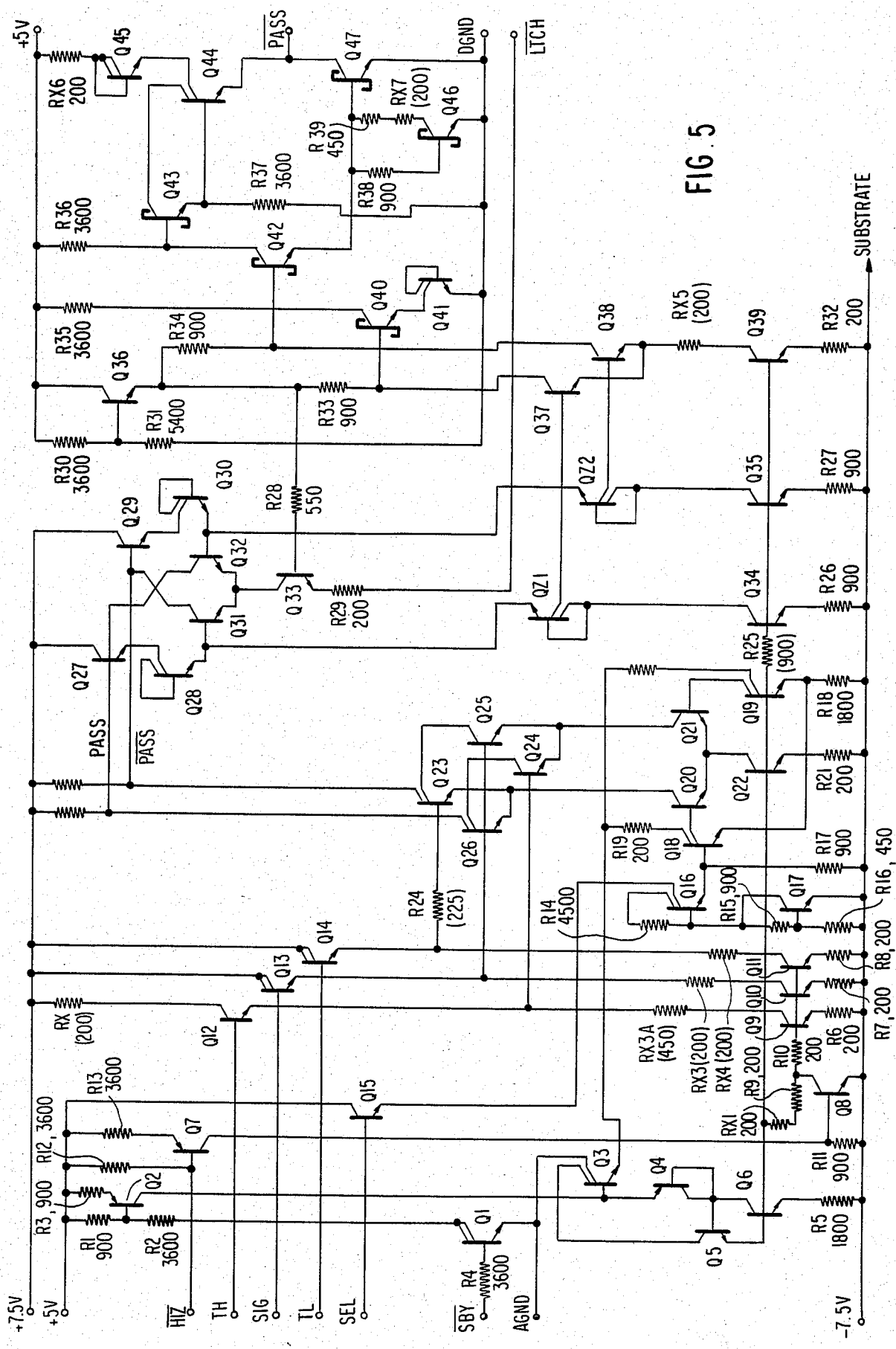

FIG. 5 is a schematic circuit diagram of one specific embodiment of the comparator of FIG. 4 as implemented by conventional integrated circuit techniques. The embodiment illustrated in FIG. 5 is an example of a circuit implemented with semi-custom linear integrated circuit technology. Accordingly, a number of resistors are included in the circuit to achieve the layout from semi-custom circuitry and are not necessarily functional to the circuit. The overall circuit operates, however, essentially as illustrated in FIG. 4 and described previously. It will be understood that custom integrated circuit technology may be used to somewhat simplify this circuit arrangement while retaining the principles described herein without departing from the inventive concepts.

With reference to FIG. 5, conventional symbols and designations have been used (i.e., all active components are labelled with a designation beginning with the letter Q and all resistors are labelled with a designation beginning with the letter R). The designations "Rx" indicate resistors implemented via "cross-unders" and resistor values in parentheses are those added to achieve the semi-custom layout. AGND signifies the ±7.5 volt common and DGND signifies the 5 volt common. The remaining signal designations correspond to those previously discussed.

It can be seen in FIG. 5 that the high threshold signal TH, the input test signal SIG and the low threshold signal TL are applied through respective buffer amplifiers Q12, Q13 and Q14 to a pair of differential amplifiers comprising transistor amplifiers Q23, Q26 and Q24, Q25. The amplifier pair Q23, Q26 form a differential amplifier corresponding to the amplifier 46 in FIG. 4 and the amplifier pair Q24, Q25 correspond to the amplifier 44.

It will be appreciated that the buffer amplifiers Q12, Q13 and Q14 operate through transistors Q9, Q10 and Q11 which are controlled simultaneously between different states of conduction by the impedance control signal HIZ. In this manner, the input impedance of the comparator may be selectively varied between a relatively low value, when the transistors Q9, Q10 and Q11 are on, and relatively high value when they are off. With the transistors Q9, Q10 and Q11 on, about 3 ma. of current is created in each buffer emitter circuit and this condition ensures that negative going transistions are brought down rapidly, a desirable factor in the normal testing mode used for in-circuit tests in which test signal values are rapidly varying. For other tests, however, it may be desirable to have a high input impedance, particularly where the speed and recognition of negative-going transitions are not a problem.

Each pair of differential amplifiers has a common emitter connected to the −7.5 volt bus through a current steering network formed by transistors Q20, Q21 and Q22 controlled by transistors Q18 and Q19. This current steering network (corresponding to element 60 in FIG. 4) is controlled by the SEL signal which varies between first and second levels related to the expected result of the digital test. The SEL signal level corresponding to an expected binary "1" test signal turns the transistor Q18 on, causing the current steering network to render the high comparator (differential amplifier Q24, Q25) operative and the low comparator (differential amplifier Q23, Q26) inoperative by steering current through the amplifier pair Q24, Q25 and blocking current through the other amplifier pair Q23, Q26. The SEL signal level corresponding to an expected binary "0" test signal turns the transistor Q18 off and renders the high comparator inoperative and the low comparator inoperative by unbalancing the current steering network in the opposite direction. It will be appreciated that the current steering network will be in one state or the other but not both, so the differential amplifiers (high and low comparators) Q23, Q26 and Q24, Q25 will be operative and inoperative on a mutually exclusive basis.

In addition, the current steering network is connected through a control network comprising transistors Q1, Q2, Q4, Q5 and Q6. This control network permits the selective energization and deenergization of the entire current steering network the high/low comparator circuit and all other circuits connected to the ±7.5 volt buses in response to the on/off control or standby signal SBY. Thus, in an in-circuit tester of the type which includes a greater number of comparators than are needed for testing at any particular instant (e.g., 200 comparators for 200 test points with only 10 test points being monitored and tested at any instant), at least some of the unnecessary comparators are deenergized, i.e. reduced or no supply current is drawn thereby reducing overall power consumption.

It can be seen in FIG. 5 that the output terminals of the differential amplifiers Q23, Q26 and Q24, Q25 are connected to form a pair of common output terminals. Specifically the collector terminals of transistors Q23 and Q25 are connected to form one common output terminal and the collector terminals of the transistors Q24 and Q26 are connected to form the other common output terminal. It will be appreciated that the common output terminal connected to load resistor R22 will be at a high signal level (+7.5 volts) when the transistors Q24 and Q26 are off and at a low signal level (about +7.0 volts) when either of these transistors is on. Similarly, the common output terminal connected to the load resistor R23 will be at a high signal level with both of the transistors Q23 and Q25 off and at a low signal level with either of these transistors on. Accordingly, since the current steering network, in effect, enables and inhibits the differential amplifiers according to the expected logic level, the following output conditions are present at the common output terminals for various input conditions:

| | | |
|---|---|---|
| SIG(High) | SEL(High) | PASS(High) |
| SIG(Low) | SEL(Low) | PASS(High) |
| SIG(Low) | SEL(High) | PASS(Low) |
| SIG(High) | SEL(Low) | PASS(Low) |
| TH>SIG>TL | SEL(Hi/Lo) | PASS(Low) |
| SBY | | PASS(High) |

The first two sets of input conditions set forth above are the only test conditions for which a "pass" indication should be generated and, as can be seen, the PASS signal is high (and the PASS signal is low) for only those two sets of test conditions. Thus, the differential output signal between the common output terminals clearly provides as pass/fail indication which, after appropriate signal conditioning, can be used directly as a test result. The standby condition with the linear comparison circuits deenergized also produces a pass condition which is desirable since placing the comparator in standby should not produce a failure indication.

In the FIG. 5 embodiment, the output signal across the common output terminals is first conditioned by application through buffer amplifier Q27, Q29 to a latch circuit formed by transistors Q28, Q30, Q31, Q32 and Q33, controlled by the latch signal LTCH. Transistors QZ1 and QZ2 operate as a conventional Zener diode type level shifter and transistors Q37 and Q38 are connected to provide differential amplifier for amplification of the differential output signal. The remaining circuitry is essentially a logic buffer with voltage limiting and load balancing circuits. This logic buffer provides a PASS output signal (the inverse of PASS) which varies between logic levels appropriate for use by other digital logic circuits in the system.

The principles, preferred embodiment and modes of operation of the present invention have been described in the foregoing specification. The invention which is intended to be protected herein, however, is not to be construed as limited to the particular forms disclosed, since these are to be regarded as illustrative rather than restrictive. Moreover, variations and changes may be made by those skilled in the art without departing from the spirit of the present invention.

What is claimed is:

1. Apparatus for determining whether a digital test signal qualifies as an expected digital logic level comprising:

first comparing means for producing an output signal in response to a level of the digital test signal above a predetermined high threshold level;

second comparing means for producing an output signal in response to a level of the digital test signal below a predetermined low threshold level; and, control means for inhibiting the production of the output signal from said first comparing means while enabling the production of the output signal from said second comparing means in response to an expected low logic level and for enabling the production of the output signal from said first comparing means while inhibiting the production of the output signal from said second comparing means in response to an expected high logic level, the output signal from the enabled one of the first and second comparing means thereby indicating whether the digital test signal qualifies as an expected digital logic level.

2. The apparatus of claim 1 wherein said first and second comparing means each comprise a differential amplifier having inverting and noninverting input terminals, the digital test signal being applied to an inverting input terminal of one differential amplifier and to the non-inverting input terminal of the other differential amplifier, the high and low threshold levels being represented by respective high and low level signals applied to one and the other of the remaining inverting and the non-inverting input terminal of the differential amplifier, said control means being connected to the differential amplifiers to selectively enable and inhibit their operation.

3. The apparatus of claim 2 wherein each of said differential amplifiers includes a pair of output terminals, the output terminals of one amplifier being connected to like output terminals of the other amplifier to form two common output terminals providing a differential output signal from the amplifier enabled by the control means.

4. The apparatus of any one of claims 1, 2 or 3 wherein said control means includes means for disabling and enabling the operation of said first and second comparing means on a mutually exclusive basis in response to said expected high and low logic levels.

5. The apparatus of claim 2 wherein each differential amplifier includes a pair of amplifiers with a common emitter terminal, said control means comprising means for controlling current flow to the common emitter terminal of each differential amplifier in response to a signal related to said expected high and low logic level.

6. The apparatus of claim 1 wherein said first and second comparing means each comprise a differential amplifier and wherein said control means comprises current steering means for selectively steering current through one or the other but not both of said differential amplifiers in response to a signal related to the expected high and low logic levels.

7. The apparatus of any one of claims 1, 2, 3, 5 or 6 including buffer means for selectively varying the input impedance of said first and second comparing means in response to an impedance control signal.

8. The apparatus of any one of claims 1, 2, 3, 5 or 6 including means for selectively energizing and deenergizing both said first and second comparing means in response to a standby control signal.

9. The apparatus of claim 8 including buffer means for selectively varying the input impedance of said first and second comparing means in response to an impedance control signal.

10. A digital comparator for determining if the logic level of a test signal corresponds to an expected logic level comprising:

first and second differential amplifiers each including an inverting and a non-inverting input terminal and first and second differential output terminals, the test signal being applied to the inverting input terminal of the first differential amplifier and to the non-inverting input teminal of the second differential amplifier, first and second threshold level signals each related to a different logic level being applied, respectively, to the non-inverting input terminal of the first differential amplifier and the inverting input terminal of the second differential amplifier, the first output terminal of the first and second differential amplifiers being connected to form a first common output terminal and the second output terminal of the first and second differential amplifiers being connected to form a second common output terminal; and, means for controlling the operation of the first and second differential amplifiers in response to a control signal related to the expected logic level such that for one expected logic level one of the differential amplifiers is operative and the other is inoperative, and for another expected logic level the other of the differential amplifiers is operative and the one of the differential amplifiers is inoperative, whereby a differential output signal between the common output terminals of the differential amplifiers indicates that the test signal qualifies or does not qualify as an expected binary logic level.

11. The digital comparator of claim 10 wherein each of said differential amplifiers includes an emitter circuit, each differential amplifier being rendered inoperative in response to an open circuit condition of the emitter circuit and being rendered operative in response to a closed circuit condition of the emitter circuit, said controlling means comprising means for opening and closing the emitter circuits of said differential amplifiers on a mutually exclusive basis in response to said control signal.

12. The apparatus of claim 1 further comprising signal conditioning means connected in parallel with said first and said second comparing means for conditioning the output of said enabled comparing means, for comparing that conditioned output with the expected digital logic level of a functioning digital device, and for indicating whether such comparison results in substantially equivalent values, thereby indicating whether the digital device under test is or is/not functioning.

13. The digital comparator of claim 10 further comprising signal conditioning means connected in parallel with said common output terminals of said first and second differential amplifiers for conditioning the output of said operative differential amplifier, for comparing that conditioned output with the expected digital logic level of a functioning digital device, and for indicating whether such comparison results in substantially equivalent values, therefore indicating whether the digital device under test is or is/not functioning.

* * * * *